United States Patent [19]
Noguchi

[11] Patent Number: 6,100,177
[45] Date of Patent: *Aug. 8, 2000

[54] GROOVED WIRING STRUCTURE IN SEMICONDUCTOR DEVICE AND METHOD FOR FORMING THE SAME

[75] Inventor: Ko Noguchi, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/867,802

[22] Filed: Jun. 3, 1997

[30] Foreign Application Priority Data

Jun. 3, 1996 [JP] Japan .................................. 8-139999

[51] Int. Cl.$^7$ .............................................. H01L 21/4763
[52] U.S. Cl. ........................... 438/620; 438/637; 438/638
[58] Field of Search ..................... 257/774, 775, 257/752, 759, 760, 763–773, 784; 438/699, 692, 959, 427, 435, 620, 637, 638

[56] References Cited

U.S. PATENT DOCUMENTS

| | | | |
|---|---|---|---|
| 4,767,724 | 8/1988 | Kim et al. ................................. | 257/752 |
| 4,789,648 | 12/1988 | Chow et al. ............................. | 438/699 |
| 4,944,836 | 7/1990 | Beyer et al. ............................. | 156/645 |
| 5,173,442 | 12/1992 | Carey ....................................... | 437/173 |
| 5,266,446 | 11/1993 | Chang et al. ............................ | 438/699 |
| 5,328,553 | 7/1994 | Poon ....................................... | 438/699 |
| 5,696,406 | 12/1997 | Ueno ....................................... | 257/784 |
| 5,702,982 | 12/1997 | Lee et al. ................................ | 437/195 |
| 5,717,251 | 2/1998 | Hayashi et al. ........................ | 257/774 |
| 5,741,741 | 4/1998 | Tseng ...................................... | 438/637 |

FOREIGN PATENT DOCUMENTS

| | | |
|---|---|---|
| 63-271958 | 11/1988 | Japan . |
| 7-106324 | 4/1995 | Japan . |
| 07130737 | 5/1995 | Japan . |
| 7-77218 | 8/1995 | Japan . |

*Primary Examiner*—Richard Booth
*Assistant Examiner*—David A. Zarneke
*Attorney, Agent, or Firm*—Foley & Lardner

[57] ABSTRACT

In a semiconductor device comprising a first level insulator film formed on a silicon substrate, a first level wiring conductor formed on the first level insulator film, and a second level insulator film formed to cover the first level wiring conductor and the first level insulator film, openings are formed in the second level insulator film, and second level wiring conductors are formed to fill up the openings. The openings including a through-hole type opening and at least two groove type openings having different depths, and the through-hole type opening extends through one of the at least two groove type openings to reach the first level wiring conductor. The grooved wiring conductors having different film thicknesses are provided in the same wiring conductor level.

5 Claims, 14 Drawing Sheets

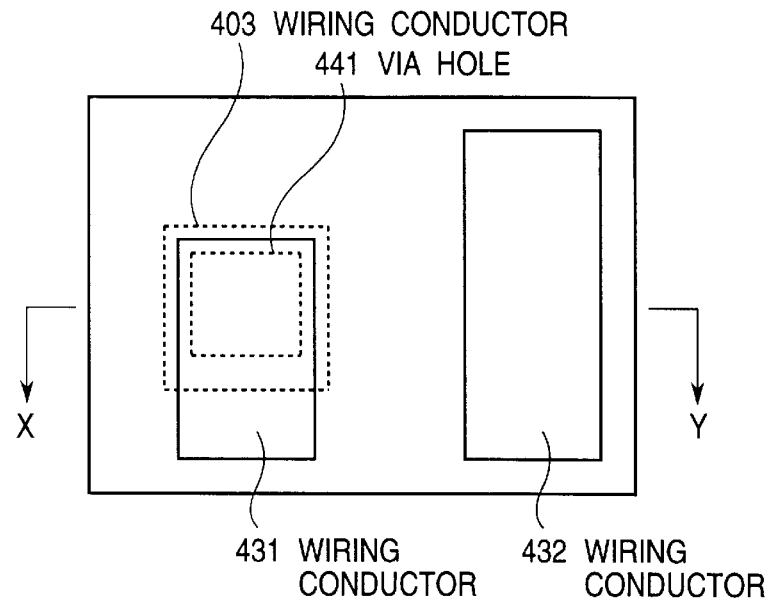
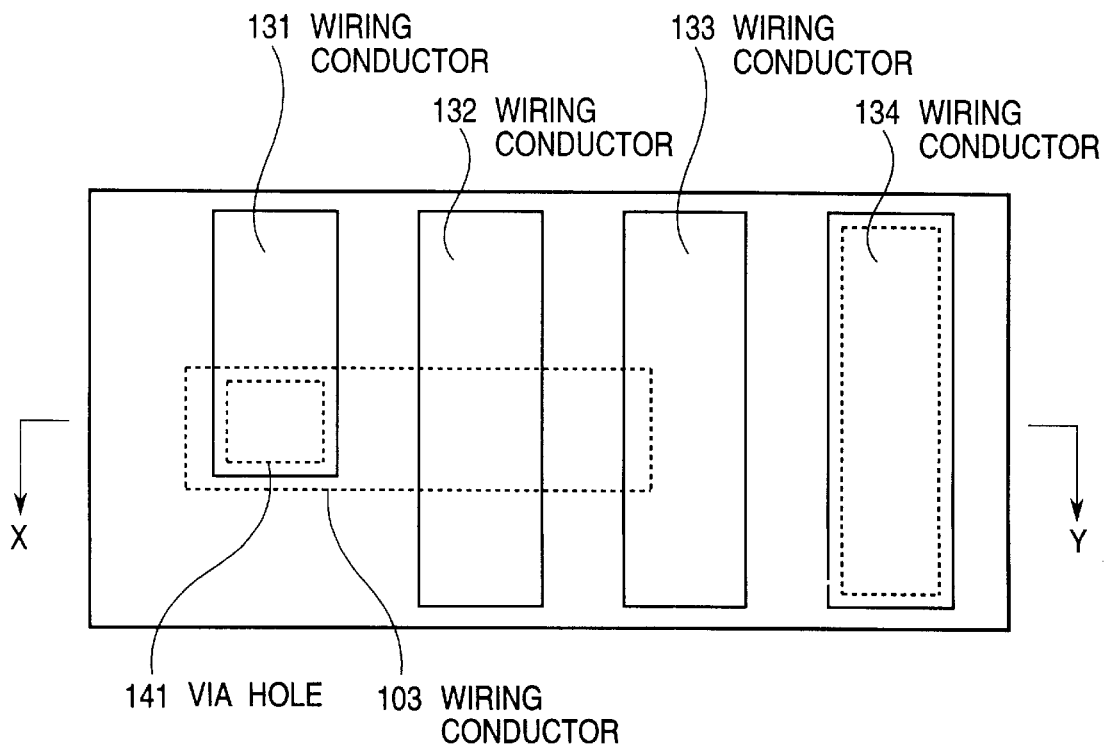

MASK FOR FIRST LEVEL WIRING CONDUCTOR

MASK FOR THROUGH HOLE

MASK FOR SECOND LEVEL WIRING CONDUCTOR

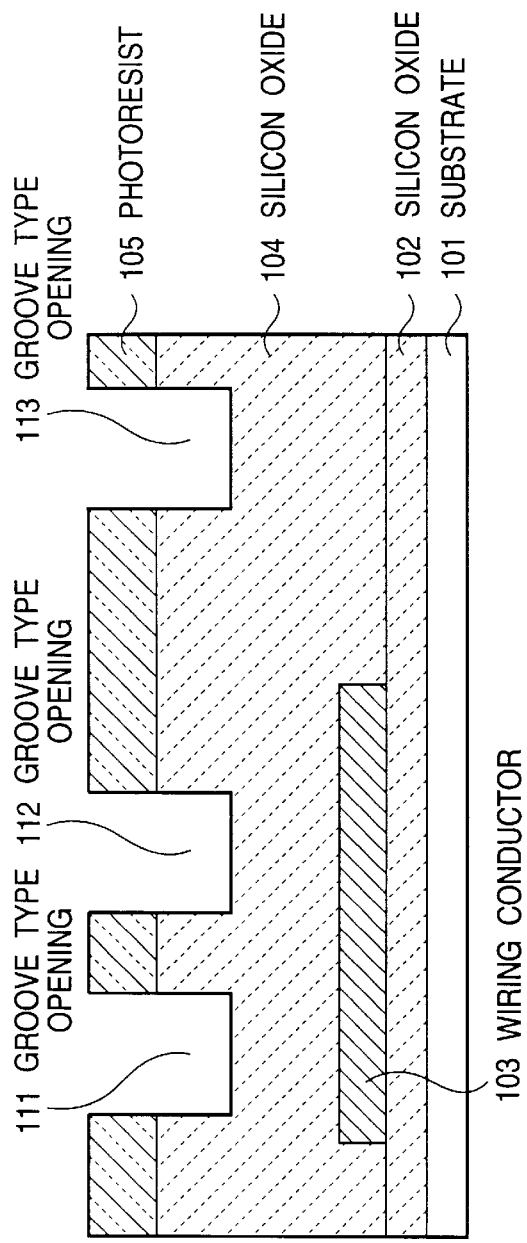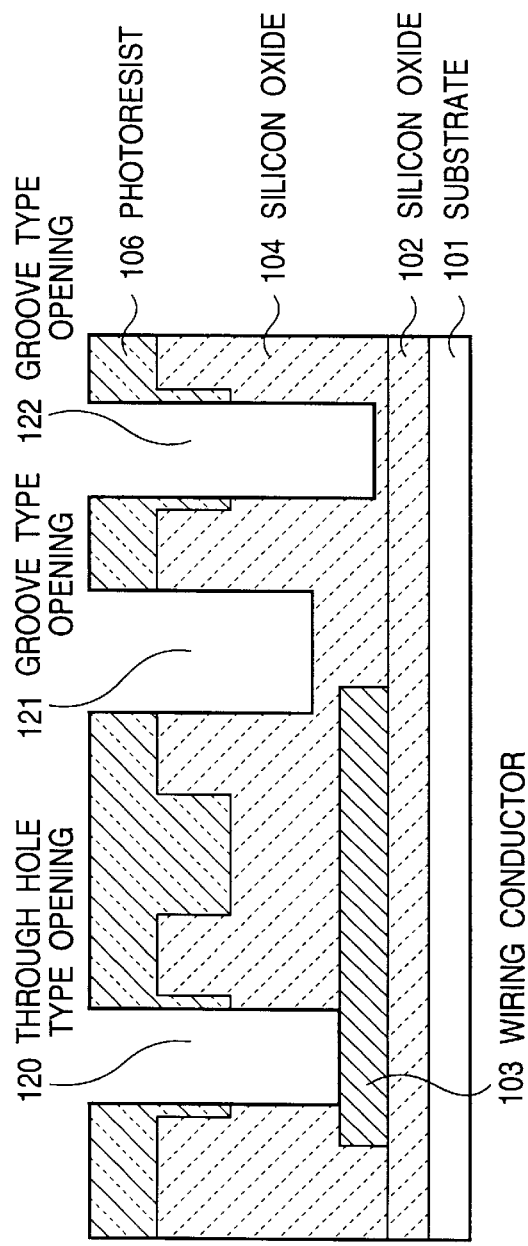
Fig. 4A
Fig. 4B

MASK FOR FIRST LEVEL WIRING CONDUCTOR

MASK FOR GROOVE TYPE OPENING

MASK FOR TROUGH HOLE TYPE OPENING
AND SELECTED GROOVE TYPE OPENING

MASK FOR FIRST LEVEL WIRING CONDUCTOR

MASK FOR GROOVE TYPE OPENING

MASK FOR TROUGH HOLE TYPE OPENING AND SELECTED GROOVE TYPE OPENING

Fig. 12A  MASK FOR FIRST LEVEL WIRING CONDUCTOR
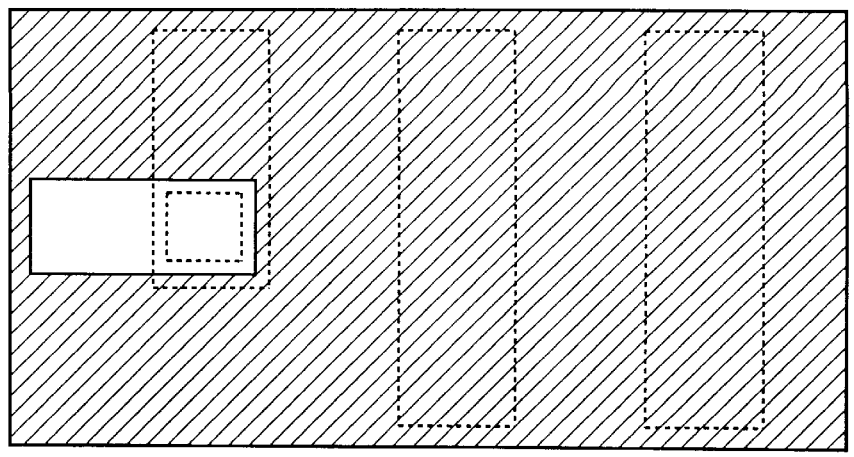
Fig. 12B  MASK FOR TROUGH HOLE TYPE OPENING AND SELECTED GROOVE TYPE OPENING
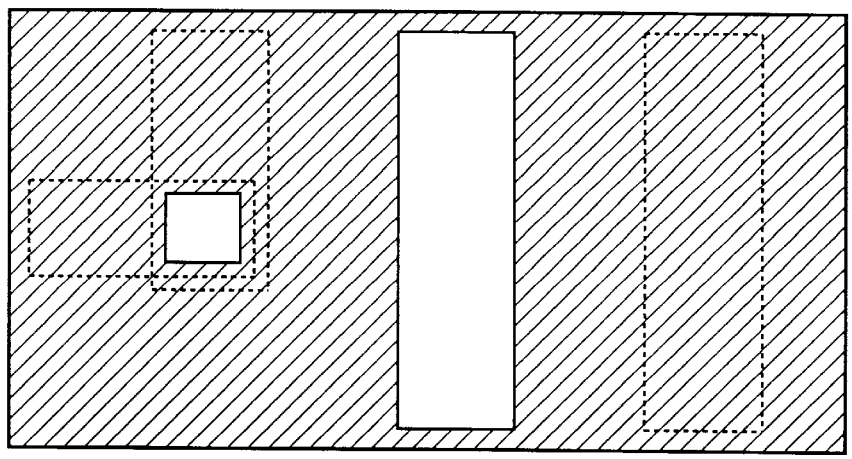
Fig. 12C  MASK FOR GROOVE TYPE OPENING
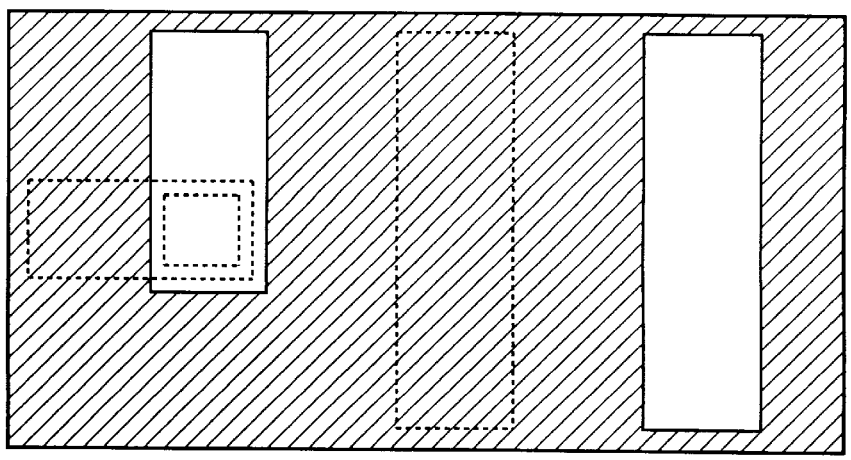

GROOVED WIRING STRUCTURE IN SEMICONDUCTOR DEVICE AND METHOD FOR FORMING THE SAME

BACKGROUND OF THE INVENTION

1. Field of the Invention

The present invention relates to a semiconductor device and a method for manufacturing the same, and more specifically to a grooved wiring structure in the semiconductor device and a method for forming the same.

2. Description of Related Art

In the prior art, a method has been known in which a groove type opening and a through-hole type opening are formed in an interlayer insulator film formed to cover a substrate and an underlying wiring conductor, and then filled with a metal, so that a via hole and an upper level wiring conductor are simultaneously formed. This method is disclosed in for example Japanese Patent Application Pre-examination Publication No. JP-A-63-271958, an English abstract of which is available from the Japanese Patent Office. The content of the English abstract of JP-A-63-271958 is incorporated by reference in its entirety into this application.

Now, a prior art process for the above mentioned method will be described with reference to FIGS. 1A to 1F, which are diagrammatical sectional views of a portion of a semiconductor device for illustrating the prior art process in the case of forming a via hole and an upper level wiring conductor above a lower level wiring conductor, although JP-A-63-271958 discloses an example of forming a wiring conductor over an insulator layer covering a diffused layer, in electrical connection with the diffused layer through a contact hole.

As shown in FIG. 1A, after a first level silicon oxide film 402 is formed on a silicon substrate 401, a first level wiring conductor A 403 is formed of for example aluminum in a predetermined shape on the first level silicon oxide film 402, and then, a second level silicon oxide film 404 is formed to cover the whole surface.

Thereafter, as shown in FIG. 1B, a photoresist film 405 patterned by a conventional photolithography is formed on the second level silicon oxide film 404, and an anisotropic etching is performed to the second level silicon oxide film 404 using the patterned photoresist film 405 as a mask, so that a through-hole type opening 420 (for a via hole) is formed to penetrate through the second level silicon oxide film 404 and to reach the first level wiring conductor A 403.

After the photoresist 405 is removed, a second photoresist film 406 having a predetermined shape patterned by a conventional photolithography is formed on the second level silicon oxide film 404, and then, the second level silicon oxide film 404 is anisotropically etched using the patterned photoresist film 406 as a mask, so that groove type openings 411 and 412 for a second level wiring conductor are formed to reach an intermediate depth of the second level silicon oxide film 404, as shown in FIG. 1C. In this process, since the through-hole type opening 420 formed in the former step is sufficiently deep, the photoresist film 406 remains at a bottom of the through-hole type opening 420.

By removing the photoresist film 406, a via hole 441 and groove type openings 411 and 412 are formed as shown in FIG. 1D.

Then, a metal, for example, aluminum, 407 is deposited over the whole surface to fill the via hole 441 and the groove type openings 411 and 412, as shown in FIG. 1E.

Furthermore, the whole surface is etched back, so that the aluminum is caused to remain only in the via hole 441 and the groove type openings 411 and 412, as shown in FIG. 1F. As a result, the first level wiring conductor A 403 is connected through the aluminum filled in the via hole 441, to a second level wiring conductor B 431 which is formed of aluminum filled in the groove type opening 411. In addition, another second level wiring conductor C 432 is also formed of aluminum filled in the groove type opening 412, as an independent second level wiring conductor.

FIG. 2 is a diagrammatic plan view of the prior art semiconductor device, and a sectional view taken along the line X-Y in FIG. 2 corresponds to FIG. 1F. In addition, FIGS. 3A to 3C illustrate mask patterns used in the above mentioned photolithographic steps in the case that the photolithographic processes are a positive photoresist process. FIG. 3A illustrates the mask pattern for the first level wiring conductor A, and FIG. 3B illustrates the mask pattern of the through-hole type opening 420 for the via hole. FIG. 3C illustrates the mask pattern of the groove type openings 411 and 412 for the second level wiring conductors B and C.

As a technique for forming the grooved wiring conductor by filling up only an opening formed in the insulator film with a metal, the etchback process has been explained in the above mentioned prior art process. A CMP (chemical mechanical polishing) process is known as another technique. The technique for forming the grooved wiring conductor by means of the CMP process is disclosed by for example Japanese Patent Post-examination Publication No. JP-B-07-077218 corresponding to U.S. Pat. No. 4,944,836, the disclosure of which is incorporated by reference in its entirety into this application. In brief, an opening is formed in an insulator film covering a substrate, and a metal layer having a thickness sufficient to fill up the opening is deposited over the whole surface, and thereafter, the chemical mechanical polishing is conducted using a slurry comprising an acidic solution of dispersed alumina powder until a surface of the insulator film and a surface of the metal layer become substantially the same surface. If this technique is applied to a semiconductor device having a through-hole type opening and a groove type opening, there is obtained a surface more planarized in comparison with that obtained by using the etchback process.

In general, an operation speed of an integrated circuit depends upon a wiring resistance and a wiring capacitance, and therefore, it is preferred that both the wiring resistance and the wiring capacitance are low. However, in order to reduce the wiring resistance, it is necessary to enlarge the film thickness of the wiring conductor and the width of the wiring conductor. On the other hand, in order to reduce the wiring capacitance, it is necessary to narrow the width of the wiring conductor and to increase a spacing between adjacent wiring conductors.

As seen from the above, the above mentioned demands are not compatible, and therefore, it is a general practice in a circuit design to select suitable values by taking both the wiring resistance and the wiring capacitance into consideration. Namely, in a circuit having a circuit operation speed greatly depending upon the wiring resistance, it is advantageous to enlarge the film thickness and the width of the wiring conductor in order to reduce the wiring resistance. On the other hand, in a circuit having a circuit operation speed greatly depending upon the wiring capacitance, it is advantageous to narrow the width of the wiring conductor and to increase the spacing between adjacent wiring conductors in order to reduce the wiring capacitance. In both cases, however, a layout area becomes large, and therefore, the degree of integration density is sacrificed. Accordingly, it is difficult to make the circuit operation speed and the integration density compatible to each other.

In the prior art, furthermore, since the thickness of the wiring conductor is fixed, the wiring resistance and the wiring capacitance are determined directly by a circuit layout, and therefore, an optimum design cannot necessarily be realized.

SUMMARY OF THE INVENTION

Accordingly, it is an object of the present invention to provide a semiconductor device and a method for manufacturing the same, which has overcome the above mentioned defect of the conventional one.

Another object of the present invention is to provide a semiconductor device having an elevated circuit operation speed and an elevated integration density, by enlarging the width of selection in the wiring resistance and the wiring capacitance at the integrated circuit designing step, thereby to elevate the degree of freedom in the design.

Still another object of the present invention is to provide a semiconductor device manufacturing method capable of simplifying the circuit design.

The above and other objects of the present invention are achieved in accordance with the present invention by a semiconductor device comprising a grooved wiring conductor formed in an insulator film on a silicon substrate, in which at least two grooved wiring conductors having different film thicknesses are formed in the same wiring conductor level.

According to a second aspect of the present invention, there is provided a semiconductor device comprising openings formed in an insulator film on a silicon substrate and filled up with a metal, the openings including a through-hole type opening and at least two groove type openings having different depths.

According to a third aspect of the present invention, there is provided a semiconductor device comprising a first level insulator film formed on a silicon substrate, a first level wiring conductor formed on the first level insulator film, a second level insulator film formed to cover the first level wiring conductor and the first level insulator film, openings formed in the second level insulator film, and second level wiring conductors formed of a metal filling up the openings, the openings including a through-hole type opening and at least two groove type openings having different depths, and the through-hole type opening extending through one of the at least two groove type openings to reach the first level wiring conductor.

According to a fourth aspect of the present invention, there is provided a method for manufacturing a semiconductor device, comprising the steps of forming a first level insulator film on a silicon substrate, forming a first level wiring conductor on the first level insulator, forming a second level insulator film to cover the first level wiring conductor and the first level insulator film, forming a through-hole type opening and first and second groove type openings in the second level insulator film, forming a metal layer to cover the whole surface and to fill up the through-hole type opening and the first and second groove type openings, and partially removing the metal layer until a surface of the second level insulator film and a surface of the metal layer become substantially the same surface, wherein the through-hole type opening is formed to extend through at least a portion of the first groove type opening to reach the first level wiring conductor, the second groove type opening is formed in a location different from that of the first groove type opening or in a portion of the first groove type opening, and the first and second groove type openings have different depths.

In a specific embodiment, the through-hole type opening and the second groove type opening are formed in the same photolithographic step and in the same etching step.

The above and other objects, features and advantages of the present invention will be apparent from the following description of preferred embodiments of the invention with reference to the accompanying drawings.

BRIEF DESCRIPTION OF THE DRAWINGS

FIG. 2 is a diagrammatic plan view of the prior art semiconductor device, manufactured in accordance with the process illustrated in FIGS. 1A to 1F;

FIGS. 4A to 4D are diagrammatical sectional views, taken along the line X-Y in FIG. 5, of a portion of a semiconductor device for illustrating a first embodiment of the process in accordance with the present invention for forming a grooved wiring conductor in a semiconductor device;

FIG. 5 is a diagrammatic plan view of a first embodiment of the semiconductor device in accordance with the present invention, manufactured in accordance with the process illustrated in FIGS. 4A to 4F;

FIGS. 12A to 12C illustrate mask patterns used in the photolithographic steps performed in the process illustrated in FIGS. 10A to 10F.

DESCRIPTION OF THE PREFERRED EMBODIMENTS

Embodiment 1

Figure 1A:
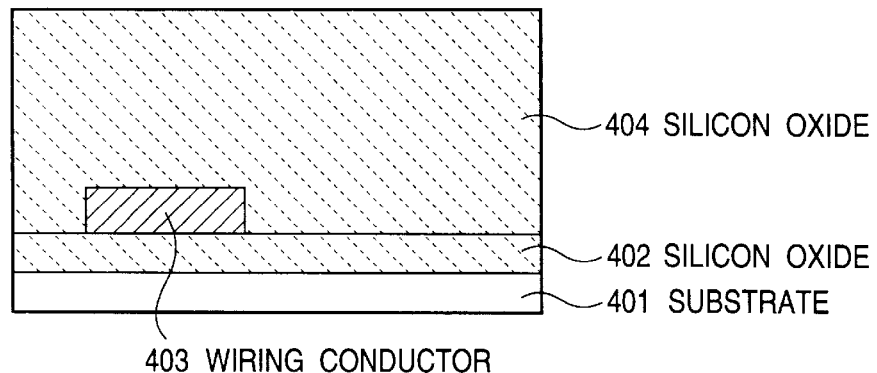
FIGS. 1A to 1F are diagrammatical sectional views, taken along the line X-Y in FIG. 2, of a portion of a semiconductor device for illustrating the prior art process in the case of forming a via hole and an upper level wiring conductor above a lower level wiring conductor.
Figure 1B:
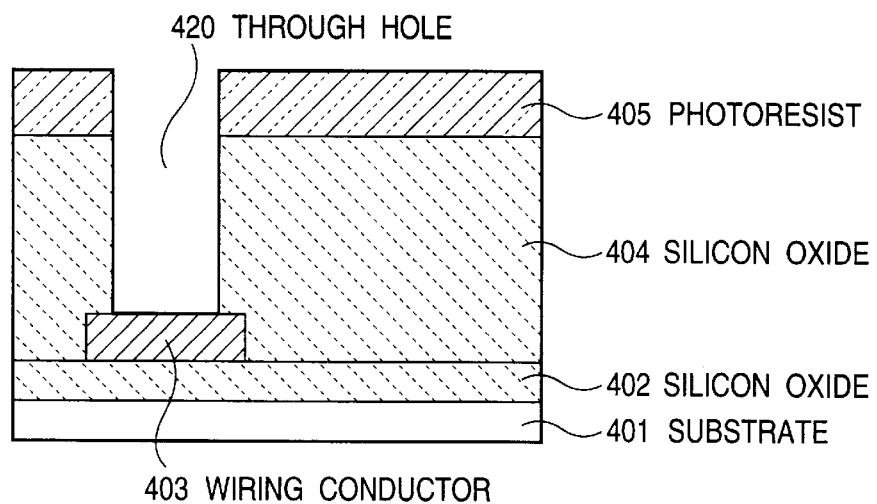
Figure 1C:
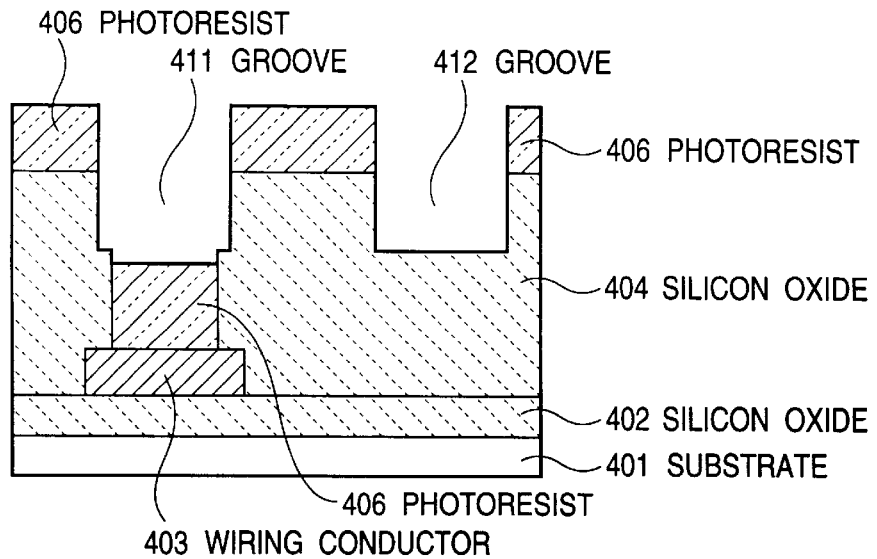
Figure 1D:
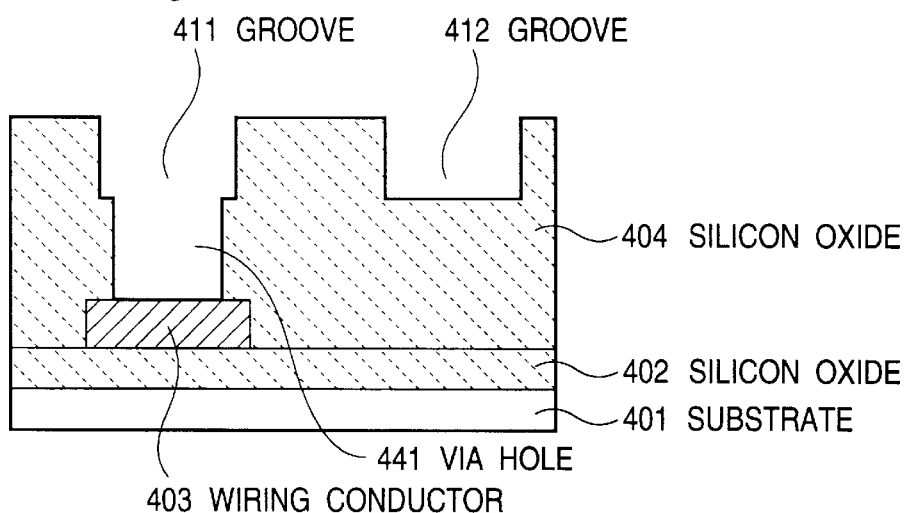
Figure 1E:
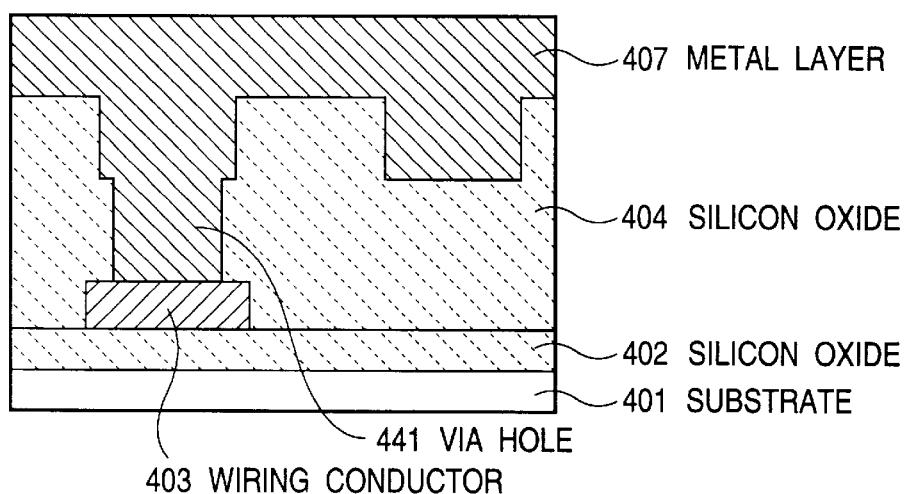
Figure 1F:
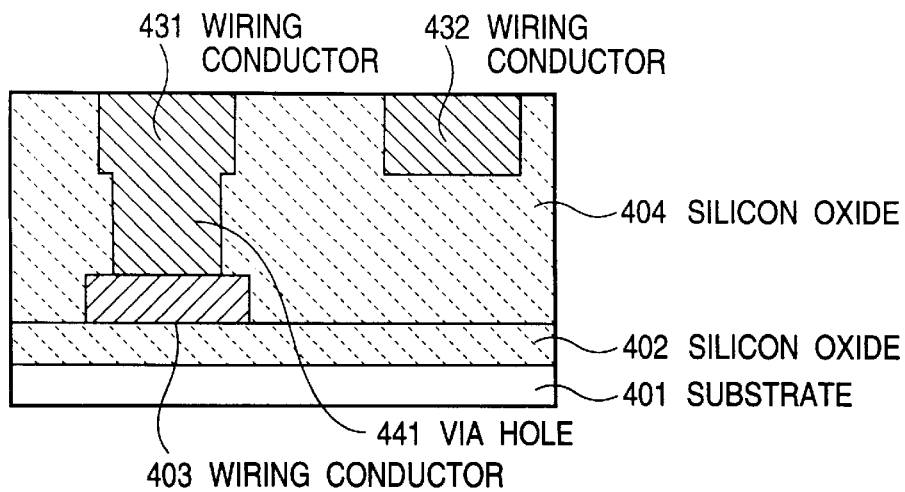
Figure 3A:
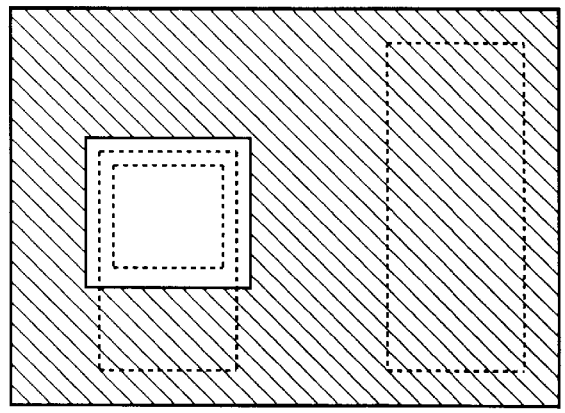
FIGS. 3A to 3C illustrate mask patterns used in the photolithographic steps performed in the process illustrated in FIGS. 1A to 1F.
Figure 3B:
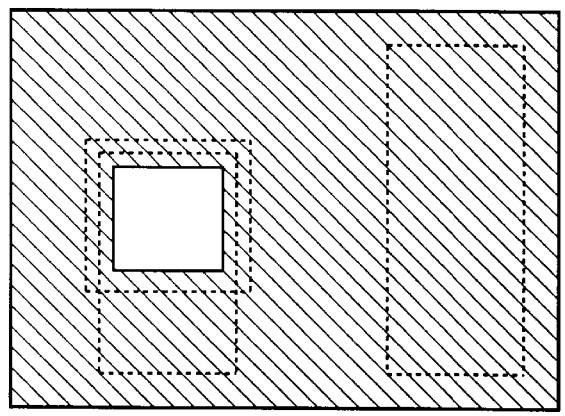
Figure 3C:
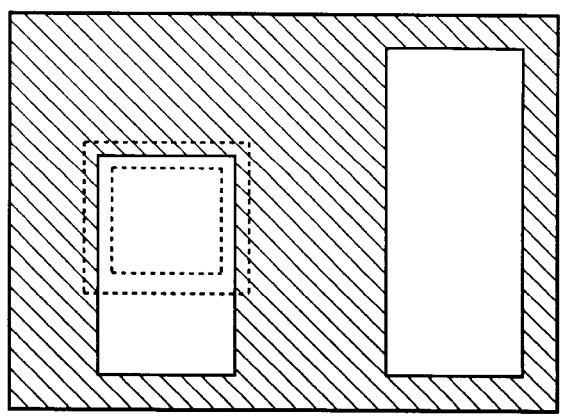
Figure 4C:
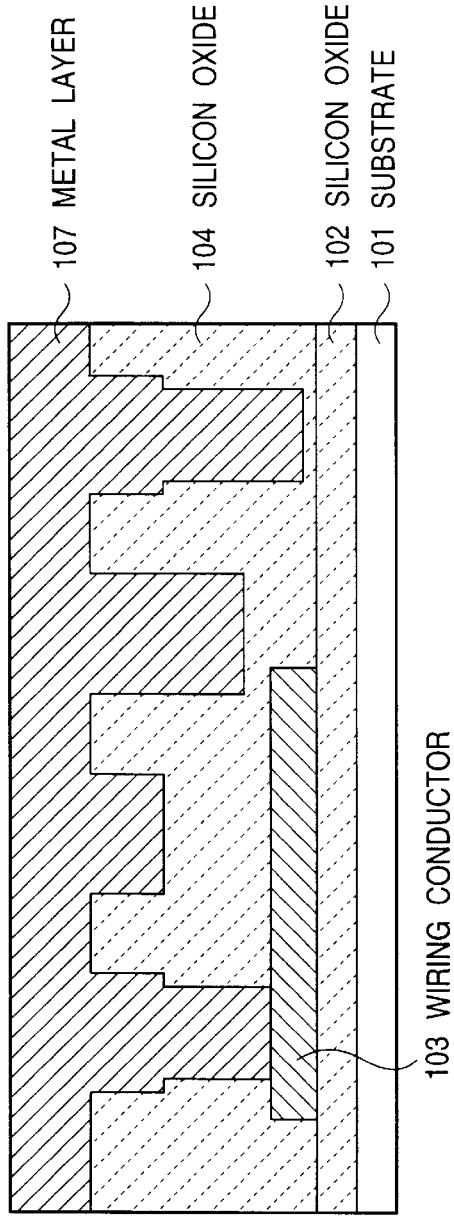
Figure 4D:
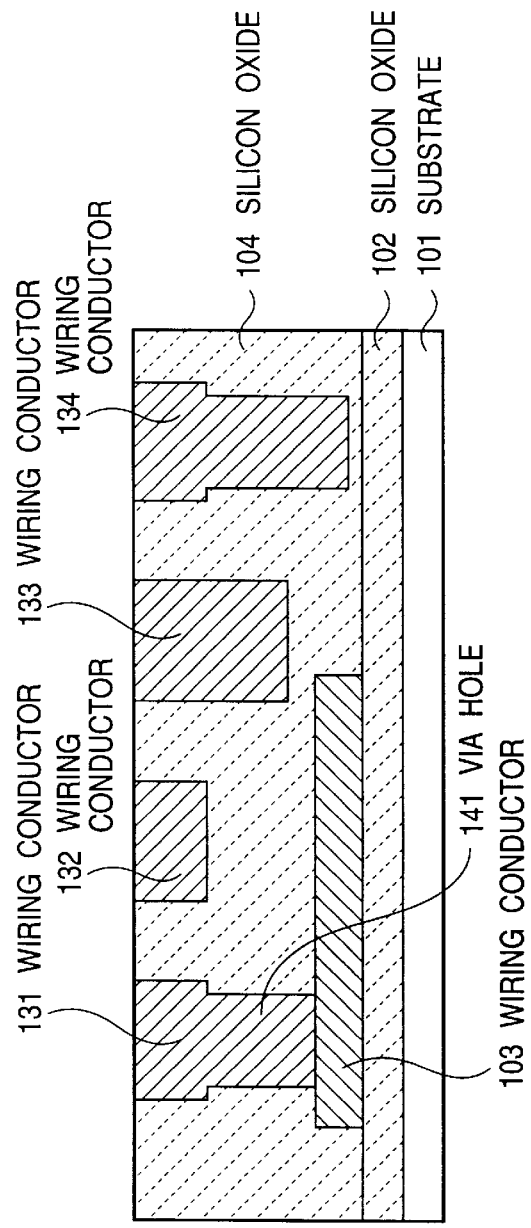

Referring to FIG. 4D, there is shown a diagrammatic sectional view of a portion of a first embodiment of the semiconductor device in accordance with the present invention. As shown in FIG. 4D, the semiconductor device includes a silicon substrate 101 and a first level silicon oxide film 102 formed to cover a principal surface of the silicon substrate 101. On the first level silicon oxide film 102, a first level wiring conductor A 103 is formed of for example an aluminum film having a thickness of 0.5 μm. This wiring conductor A 103 functions as a first level wiring conductor. In addition, a second level silicon oxide film 104 having a thickness of about 1.3 μm is formed to cover the whole surface. The second level silicon oxide film 104 functions as an interlayer insulator film.

The second level silicon oxide film 104 has groove type openings for a second level wiring conductors B to E, 131 to 134 and a through-hole type opening for a via hole 141 and these openings are filled up with aluminum. The first level wiring conductor A 103 is electrically connected through the aluminum filled in the via hole 141 to the second level wiring conductor B 131. The wiring conductors B 131 and C 132 have the thickness of about 0.5 μm and function as a second level wiring conductor. The wiring conductors D 133 has the thickness of about 1.0 μm and also functions as the second level wiring conductor. The wiring conductor E 134 is formed in an opening composed of an upper or first groove type opening portion having a depth of about 0.5 μm and a lower or second groove type opening portion having a depth of about 1.0 μm and in alignment with the upper or first groove type opening portion, and therefore, the wiring conductor E 134 has the thickness of about 1.5 μm and also functions as the second level wiring conductor.

In the prior art example, only the wiring conductors B and C are provided as the second level wiring conductor, however, in this embodiment, the wiring conductors D and E are newly provided. These wiring conductors D and E have the thickness of about 1.0 μm and the thickness of about 1.5 μm, respectively, which are two times or three times the thickness of the prior art wiring conductor. Therefore, the wiring conductors D and E greatly reduce the wiring resistance to a half or one third of that of the prior art wiring conductor.

In this embodiment, therefore, since the second level wiring conductors having three different film thicknesses are provided, the circuit can be designed with a high degree of freedom in the circuit design taking the wiring resistance and the wiring capacitance into consideration. For example, in a location where reduction of the wiring capacitance is more important than reduction of the wiring resistance, the wiring conductors B and C having the film thickness of about 0.5 μm are used, and to the contrary, in a location where reduction of the resistance is more important than reduction of the capacitance, the wiring conductor D having the film thickness of about 1.0 μm is used. Furthermore, in a location where it is very important to make the resistance as small as possible, for example, as a power supply wiring conductor through which a large current is caused to flow, the further thicker wiring conductor E having the film thickness of about 1.5 μm can be used.

Incidentally, the wiring conductors B, C and D can be located anywhere with no restriction in layout, but the wiring conductor E can be located only in an area where no underlying wiring conductor A exists.

Now, a first embodiment of the process in accordance with the present invention for forming the grooved wiring conductor structure shown in FIG. 4D, will be described with reference to FIGS. 4A to 4D.

After the first level silicon oxide film 102 is formed on the silicon substrate 101 as shown in FIG. 4A, an aluminum film patterned in a predetermined shape and having a thickness of for example 0.5 μm is formed on the first level silicon oxide film 102, as the wiring conductor A 103. Thereafter, a second level silicon oxide film 104 is formed to cover the whole surface, and a surface of the second level silicon oxide film 104 is planarized by the CMP process until the thickness of the second level silicon oxide film 104 on the wiring conductor A becomes about 1.3 μm.

Succeedingly, by using as a mask a photoresist film 105 patterned in a conventional photolithography, the second level silicon oxide film 104 is selectively and anisotropically etched to a depth of about 0.5 μm, so that first groove type openings 111, 112 and 113 for the wiring conductors B 131, C 132 and E 134 are formed as shown in FIG. 4A.

After the photoresist film 105 is removed, by using as a mask another photoresist film 106 patterned similarly in the conventional photolithography, the second level silicon oxide film 104 is also selectively and anisotropically etched by a depth of about 1.0 μm so that a through-hole type opening 120 and second groove type openings 121 and 122 are formed as shown in FIG. 4B. The through-hole type opening 120 and the second groove type opening 122 are formed in the already formed first groove type openings 111 and 113, respectively, and the second groove type opening 121 is newly formed in the second level silicon oxide film 104.

In this second anisotropic etching process, since the wiring conductor A 103 exists at a bottom of the through-hole type opening 120, the depth of the through-hole type opening 120 is stopped at the depth of 0.8 μm. The second groove type opening 121 is formed above the wiring conductor A 103 and the first level silicon oxide film 102, but since the etching depth of the second level silicon oxide film by the second anisotropic etching process is about 1.0 μm, the second level silicon oxide film of the thickness of about 0.3 μm remains on the wiring conductor A 103, and the second level silicon oxide film of the thickness of about 0.8 μm remains on the first level silicon oxide film 102. Therefore, there is no risk of a short-circuiting with the wiring conductor A 103. In addition, in the second groove type opening 122, the second level silicon oxide film of the thickness of about 0.3 μm remains on the first level silicon oxide film 102, and therefore, if no wiring conductor A 103 exists on the first level silicon oxide film 102 in a location of the second groove type opening 122, there is no risk of a short-circuiting.

After the second photoresist film 106 is removed, a metal film, for example, an aluminum film 107, is formed to cover the whole surface as shown in FIG. 4C.

Then, the surface is ground by the CMP process until a surface of the aluminum film 107 and a surface of the second level silicon oxide film 104 become the same plan surface. As a result, the openings formed in the second level silicon oxide film are filled up with aluminum.

FIG. 5 is a diagrammatic plan view of the semiconductor device in accordance with the first embodiment of the present invention, and a sectional view taken along the line X-Y in FIG. 5 corresponds to FIG. 4D. FIG. 5 illustrates respective plan view shapes of the wiring conductor B 131, the wiring conductor C 132, the wiring conductor D 133, and the wiring conductor D 134, as well as respective plan view shapes of the via hole 141 and the wiring conductor A 103.

Figure 6A:
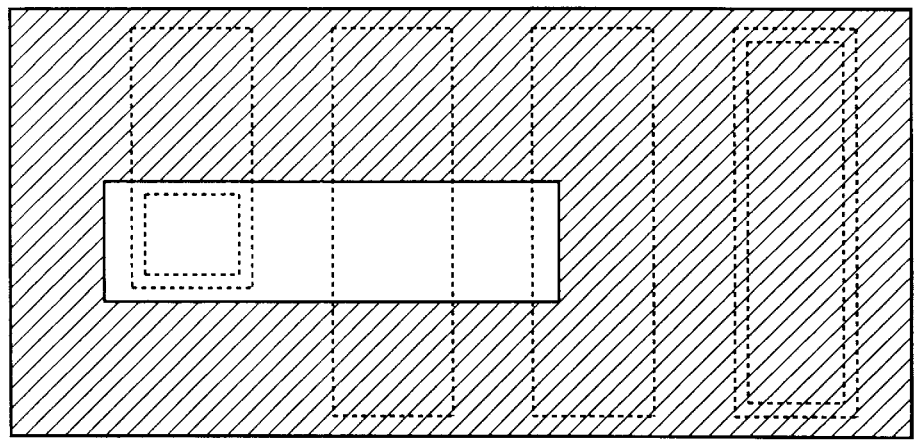
FIGS. 6A to 6C illustrate mask patterns used in the photolithographic steps performed in the process illustrated in FIGS. 4A to 4F.
Figure 6B:
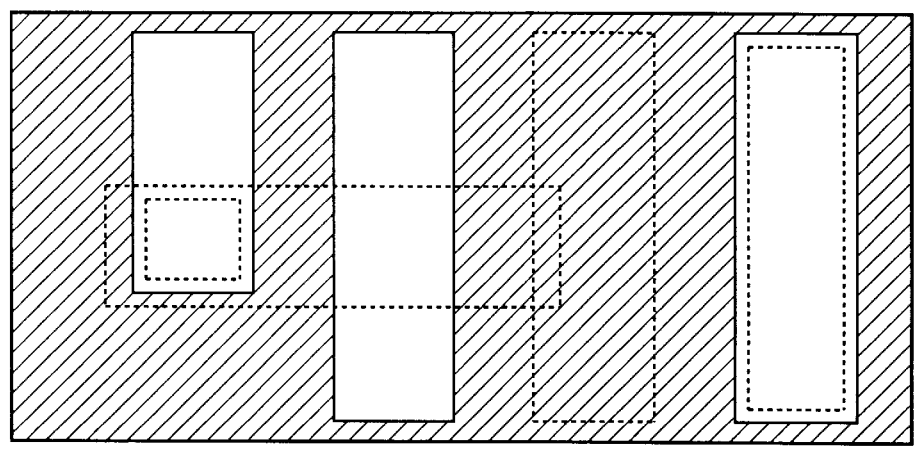
Figure 6C:
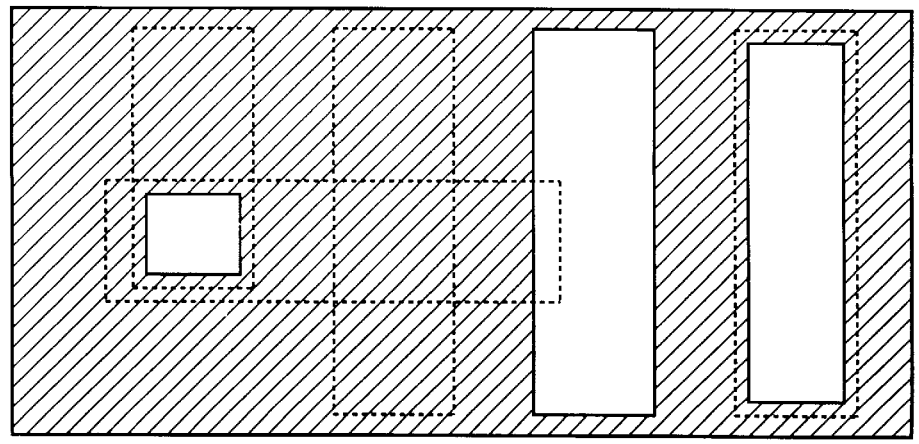

In addition, FIGS. 6A to 6C illustrate mask patterns used in the above mentioned photolithographic steps in the case that the photolithographic processes are a positive photoresist process. FIG. 6A illustrates the mask pattern for the first level wiring conductor A, and FIG. 6B illustrates the mask pattern of the groove type openings 111, 112 and 113. FIG. 6C illustrates the mask pattern of the through-hole type opening 120 for the via hole 141 and the groove type openings 121 and 122 for the wiring conductors D and E.

In the above mentioned forming process of the first embodiment, at the time of forming the groove type opening and the through-hole type opening in the second silicon oxide film which is the interlayer insulator film, the mask used for forming the via hole includes not only a mask pattern for the via hole but also a mask pattern for a wiring conductor. Therefore, it is possible to form a grooved wiring conductor having the depth comparable with the depth of the via hole, namely, a thick grooved wiring conductor. In addition, if the mask pattern for the grooved wiring conductor is formed in a position which overlaps the already formed groove type opening, it is possible to form a further deep grooved wiring conductor.

Embodiment 2

Figure 7A:
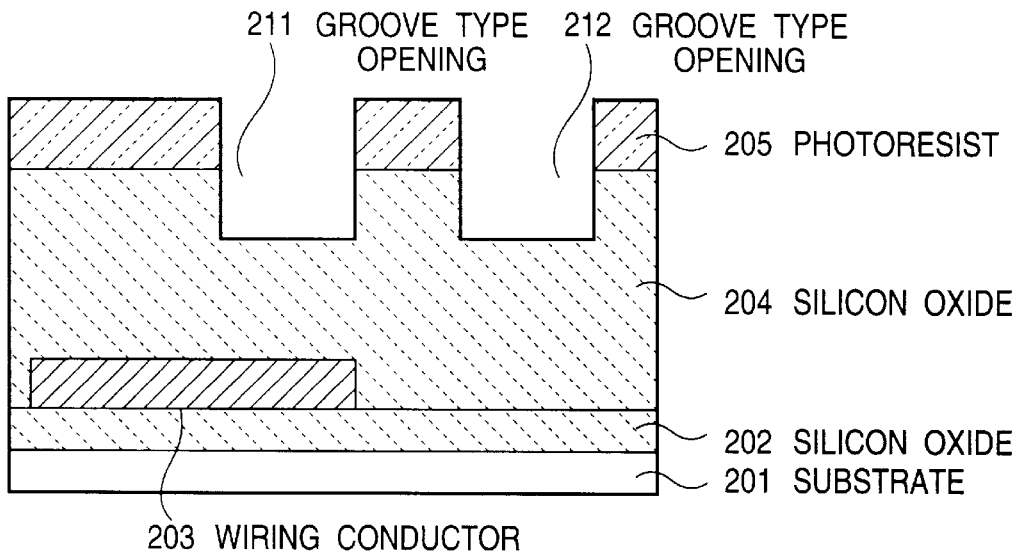
FIGS. 7A to 7D are diagrammatical sectional views, taken along the line X-Y in FIG. 8, of a portion of a semiconductor device for illustrating a second embodiment of the process in accordance with the present invention for forming a grooved wiring conductor in a semiconductor device.
Figure 7B:
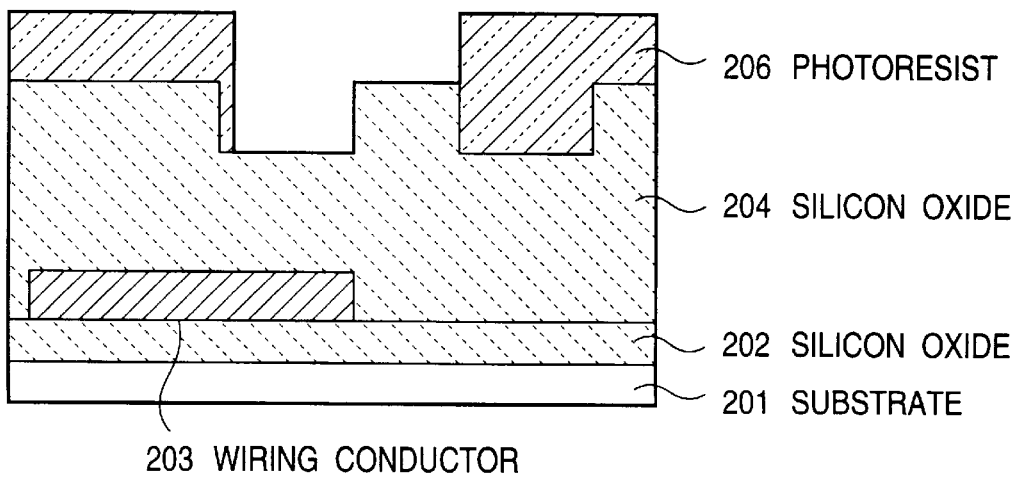
Figure 7C:
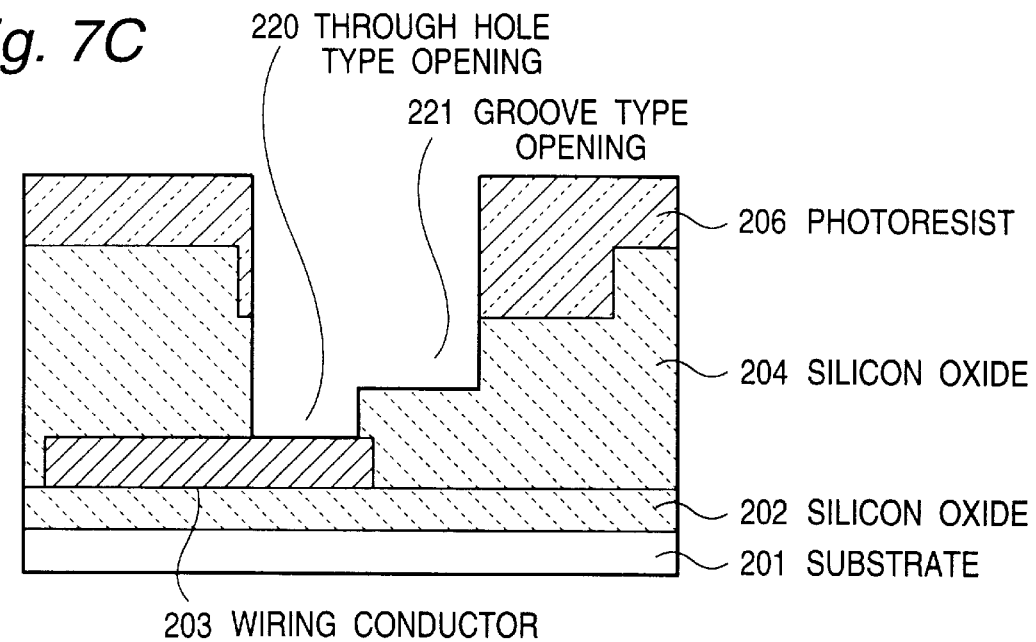
Figure 7D:
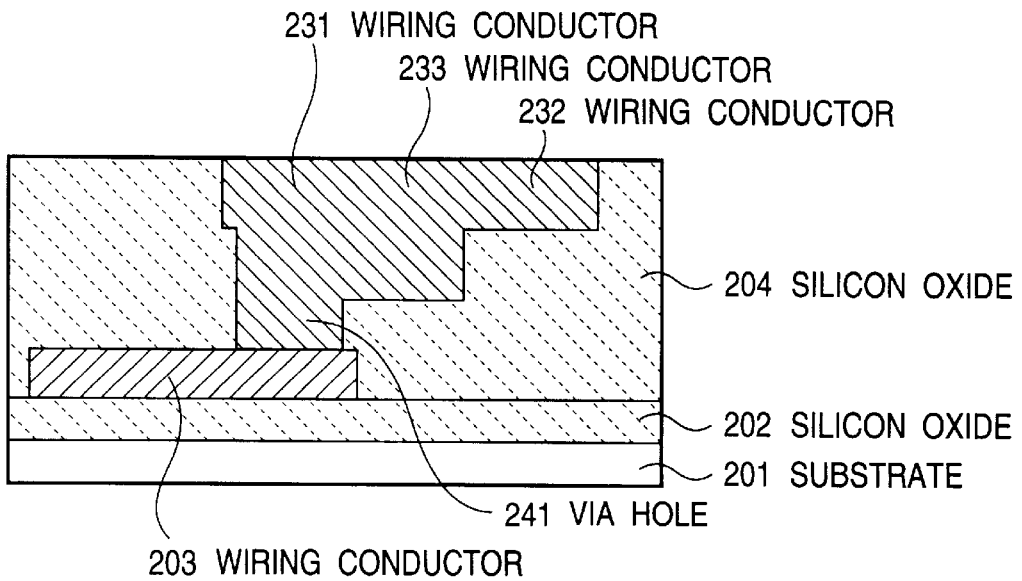

Referring to FIG. 7D, there is shown a diagrammatic sectional view of a portion of a second embodiment of the semiconductor device in accordance with the present invention. As shown in FIG. 7D, the semiconductor, device includes a silicon substrate 201 and a first level silicon oxide film 202 formed to cover a principal surface of the silicon substrate 201. On the first level silicon oxide film 202, a wiring conductor A 203 is formed of for example an aluminum film having a thickness of 0.5 $\mu$m. This wiring conductor A 203 functions as a first level wiring conductor. In addition, a second level silicon oxide film 204 having a thickness of about 1.3 $\mu$m is formed to cover the whole surface. The second level silicon oxide film 204 functions as an interlayer insulator film.

The second level silicon oxide film 204 has groove type openings and a through-hole type opening. The first level wiring conductor A 203 is electrically connected through the aluminum filled in the via hole 241 to a second level wiring conductor B 231. A wiring conductors B 231 and C 232 have the thickness of about 0.5 $\mu$m and function as a second level wiring conductor. The wiring conductors D 233 has the thickness of about 1.0 $\mu$m and also functions as the second level wiring conductor, and connects between the wiring conductors B 231 and C 232. Although the wiring conductor E 234 provided in the first embodiment is not shown in FIG. 7D, the wiring conductor E 234 may be provided in this second embodiment, similarly to the first embodiment.

Now, a second embodiment of the process in accordance with the present invention for forming the grooved wiring conductor structure shown in FIG. 7D, will be described with reference to FIGS. 7A to 7D.

After the first level silicon oxide film 202 is formed on the silicon substrate 201 as shown in FIG. 7A, an aluminum film patterned in a predetermined shape and having a thickness of for example 0.5 $\mu$m is formed on the first level silicon oxide film 202, as the wiring conductor A 203. Thereafter, a second level silicon oxide film 204 is formed to cover the whole surface, and a surface of the second level silicon oxide film 204 is planarized by the CMP process until the thickness of the second level silicon oxide film 204 on the wiring conductor A becomes about 1.3 $\mu$m.

Succeedingly, by using as a mask a photoresist film 205 patterned in a conventional photolithography, the second level silicon oxide film 204 is selectively and anisotropically etched to a depth of about 0.5 $\mu$m, so that first groove type openings 211 and 212 for the wiring conductors B 231 and C 232 are formed as shown in FIG. 7A.

After the photoresist film 205 is removed, another photoresist film 206 having a predetermined shape is formed on the second level silicon oxide film 204, as shown in FIG. 7B, similarly in accordance with the conventional photolithography.

By using the photoresist film 206 as a mask, the second level silicon oxide film 204 is selectively and anisotropically etched by a depth of about 1.0 $\mu$m, so that a through-hole type opening 220 and a second groove type opening 221 are formed as shown in FIG. 7C. In this second anisotropic etching process, since the wiring conductor A 203 exists at a bottom of the through-hole type opening 220, the depth of the through-hole type opening 220 is stopped at the depth of 0.8 $\mu$m.

After the second photoresist film 206 is removed, a metal film, for example, an aluminum film, is formed to cover the whole surface, and then, the surface is ground by the CMP process until a surface of the aluminum film and a surface of the second level silicon oxide film become the same plan surface. As a result, the openings formed in the second level silicon oxide film are filled up with aluminum, as shown in FIG. 7D.

Figure 8:
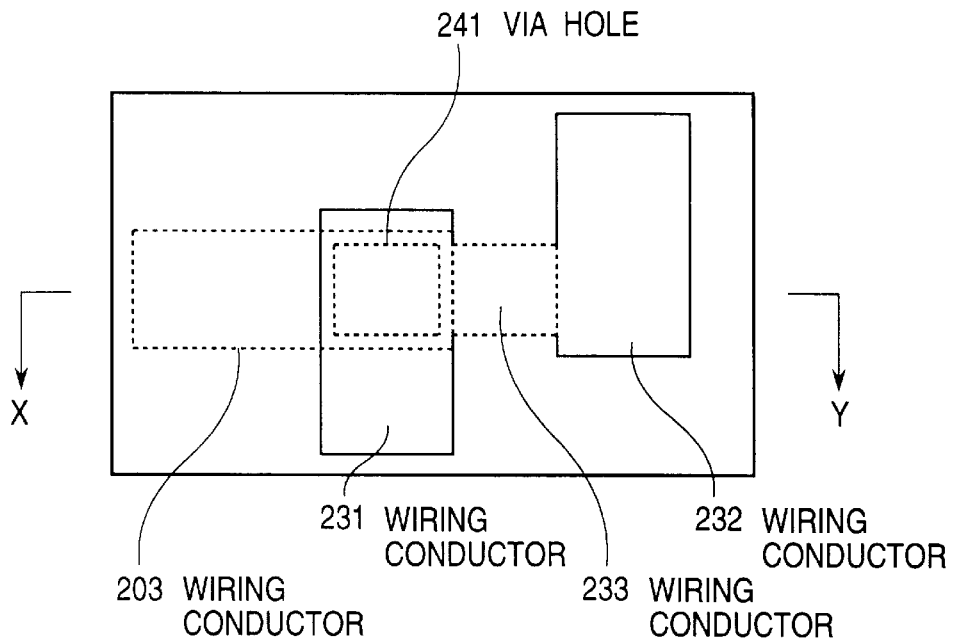
FIG. 8 is a diagrammatic plan view of a second embodiment of the semiconductor device in accordance with the present invention, manufactured in accordance with the process illustrated in FIGS. 7A to 7F.

FIG. 8 is a diagrammatic plan view of the semiconductor device in accordance with the second embodiment of the present invention, and a sectional view taken along the line X-Y in FIG. 8 corresponds to FIG. 7D.

Figure 9A:
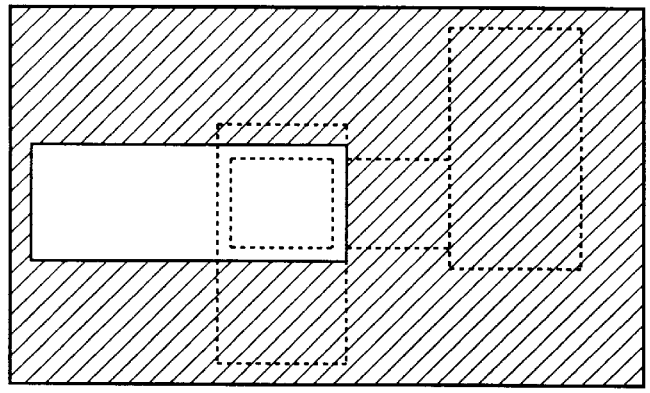
FIGS. 9A to 9C illustrate mask patterns, used in the photolithographic steps performed in the process illustrated in FIGS. 7A to 7F.
Figure 9B:
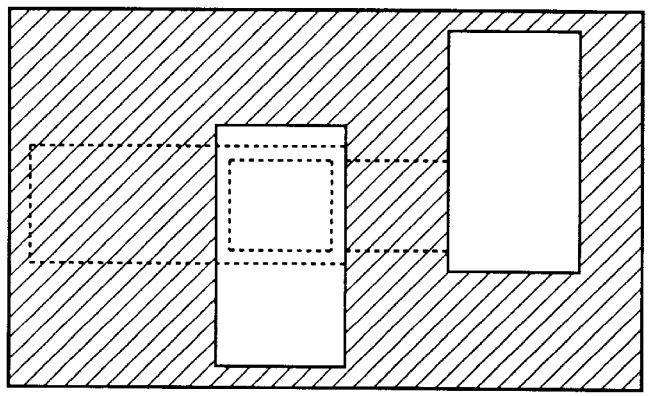
Figure 9C:
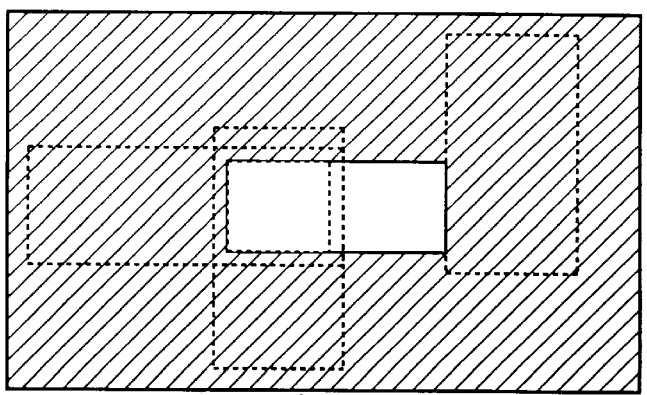

In addition, FIGS. 9A to 9C illustrate mask patterns used in the above mentioned photolithographic steps in the case that the photolithographic processes are a positive photoresist process. FIG. 9A illustrates the mask pattern for the first level wiring conductor A, and FIG. 9B illustrates the mask pattern of the first groove type openings 211 and 212. FIG. 9C illustrates the mask pattern of the through-hole type opening 220 for the via hole 241 and the second groove type openings 221 for the wiring conductor D.

In this second embodiment, the via hole connects between the first level wiring conductor and the second level wiring conductor, and in addition, the wiring conductor D having a low resistance wiring conductor formed in the groove type opening which is formed simultaneously with the via hole, connects between the second level wiring conductors B 231 and C 232, which are separated from each other.

Embodiment 3

Figure 10A:
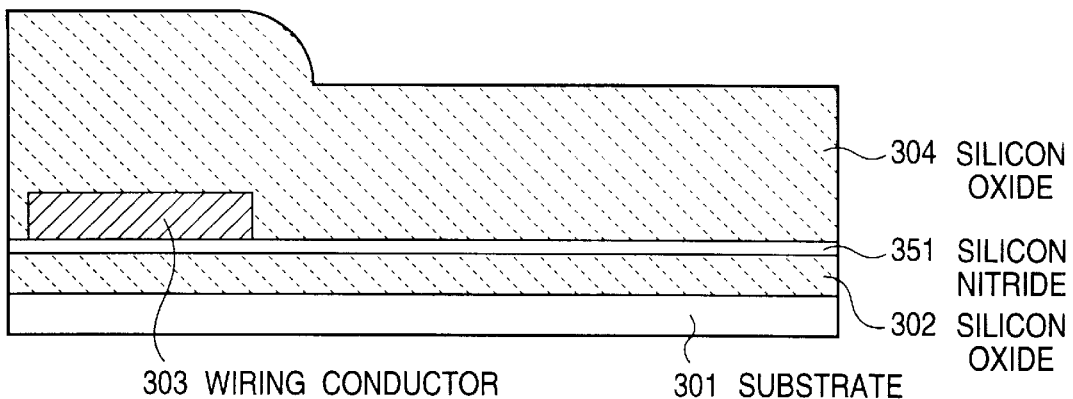
FIGS. 10A to 10F are diagrammatical sectional views, taken along the line X-Y in FIG. 11, of a portion of a semiconductor device for illustrating a third embodiment of the process in accordance with the present invention for forming a grooved wiring conductor in a semiconductor device.
Figure 10B:
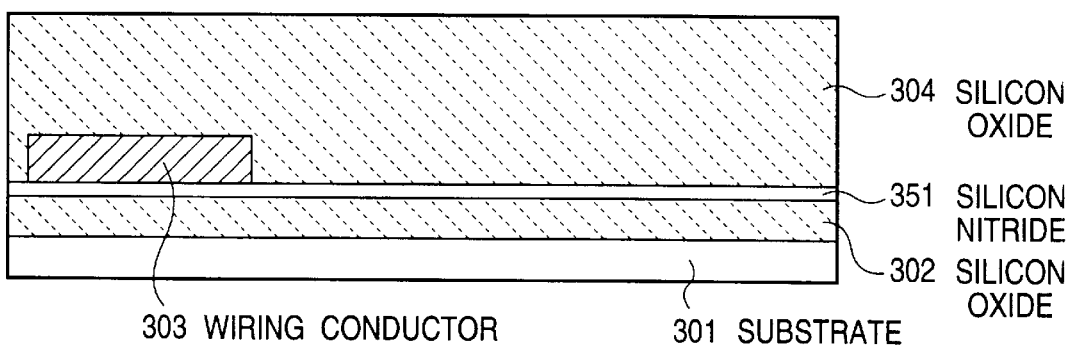
Figure 10C:
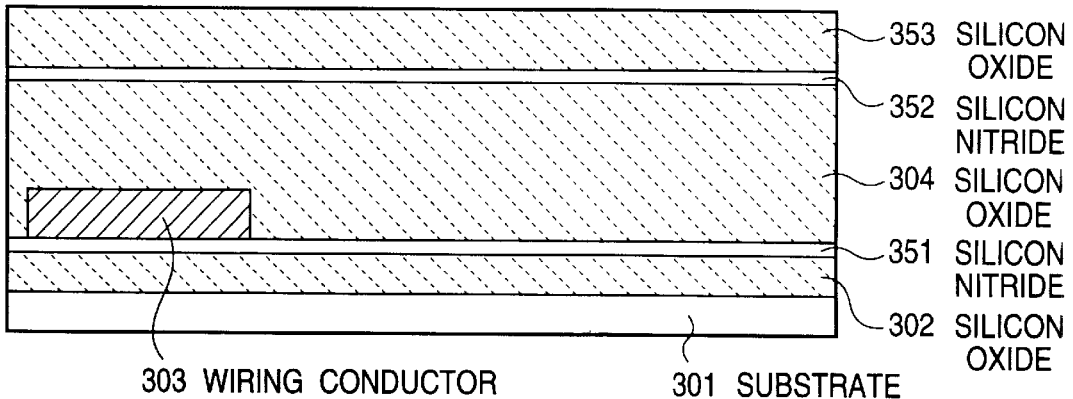
Figure 10D:
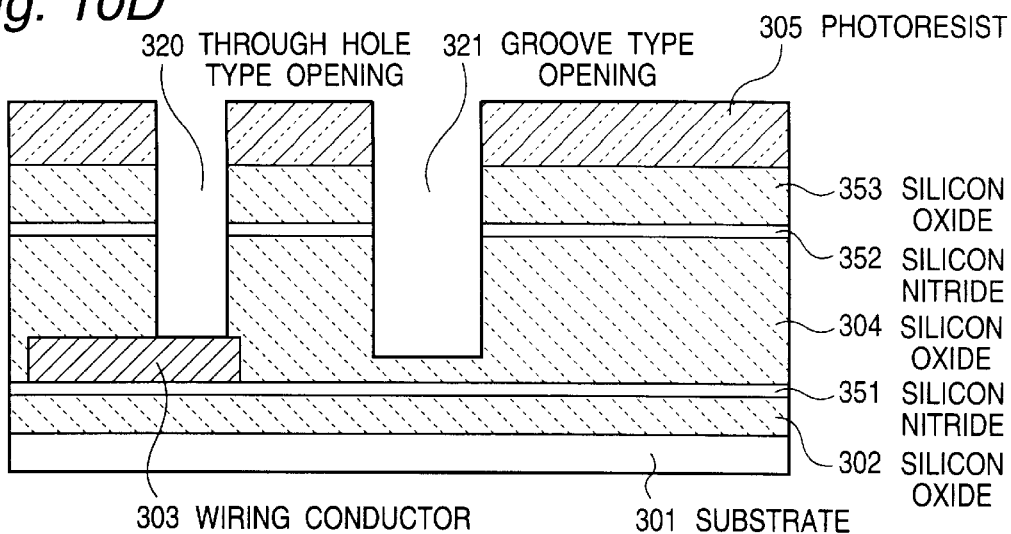
Figure 10E:
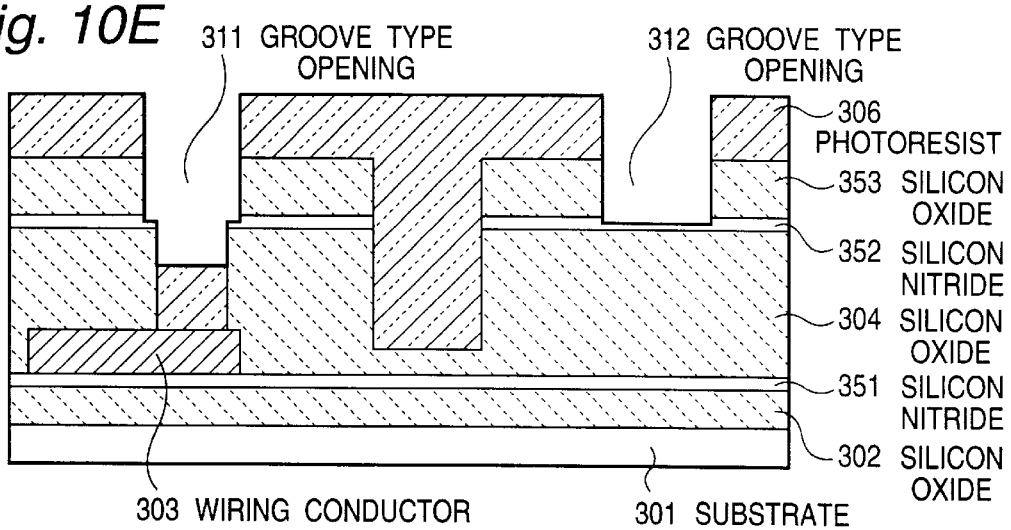
Figure 10F:
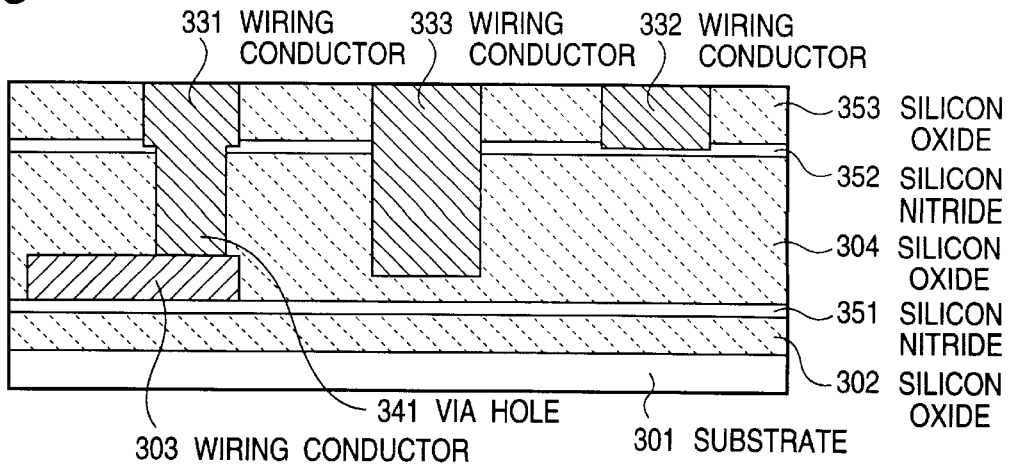

Referring to FIG. 10F, there is shown a diagrammatic sectional view of a portion of a third embodiment of the semiconductor device in accordance with the present invention.

Now, a third embodiment of the process in accordance with the present invention for forming the grooved wiring conductor structure of the third embodiment shown in FIG. 10F, will be described with reference to FIGS. 10A to 10F.

After a first silicon oxide film 302 is formed on a silicon substrate 301 as shown in FIG. 10A, a first silicon nitride film 351 having the thickness of about 0.1 $\mu$m is formed to cover the first silicon oxide film 302. On this first silicon nitride film 351, an aluminum film patterned in a predetermined shape and having a thickness of for example 0.5 $\mu$m is formed to form a wiring conductor A 303 as a first level wiring conductor. Thereafter, a second silicon oxide film 304 having the thickness of about 1.3 $\mu$m is deposited to cover the whole surface.

As shown in FIG. 10B, a surface of the second silicon oxide film 304 is ground by the CMP process until the surface of the second silicon oxide film 304 is planarized. Here, the amount of grinding is controlled to the effect that the thickness of the second silicon oxide film 304 on the wiring conductor A becomes about 0.7 $\mu$m.

Furthermore, a second silicon nitride film 352 having the thickness of about 0.1 μm is formed to cover the planarized surface of the second silicon oxide film 304, and on the second silicon nitride film 352, a third silicon oxide film 353 having the thickness of about 0.5 μm is formed, as shown in FIG. 10C.

Succeedingly, by using as a mask a photoresist film 305 patterned in a conventional photolithography, a stacked insulator film composed of the third silicon oxide film 353, the second silicon nitride film 352 and the second silicon oxide film 304, is selectively and anisotropically etched by a depth of about 1.5 μm, so that a through-hole type opening 320 and a second groove type opening 321 are formed, as shown in FIG. 10D. In this anisotropic etching, since the through-hole type opening 320 is positioned above the wiring conductor A 103, the depth of the through-hole type opening 220 becomes about 1.3 μm. On the other hand, since no wiring conductor A 103 exists at a bottom of the second groove type opening 321, the depth of the second groove type opening 321 becomes about 1.5 μm. In addition, in the processing of anisotropically etching the stacked insulator film, an etching condition including the kind of an etching gas can be changed dependently upon which of the silicon oxide film and the silicon nitride film should be etched.

After the photoresist film 305 is removed, another photoresist film 306 having a groove type opening is formed on the third silicon oxide film 353 in accordance with in the conventional photolithography. Here, since the through-hole type opening 320 is sufficiently deep, the photoresist may remain in the through-hole type opening 320.

By using the photoresist film 306 as a mask, the stacked insulator film composed of the third silicon oxide film 353, the second silicon nitride film 352 and the second silicon oxide film 304, is selectively and anisotropically etched by a depth of about 0.5 μm, so that first groove type openings 311 and 312 are formed as shown in FIG. 10E. In this anisotropically etching, it is important to select an etching condition which makes the etch rate of the silicon nitride film sufficiently smaller than the etch rate of the silicon oxide film. Namely, the silicon nitride film functions as an etching stopper in the groove etching, and therefore, the depth of the first groove type openings 311 and 312 is becomes about 0.5 μm which is at the position of the silicon nitride film.

After the second photoresist film 306 is removed, a metal film, for example, an aluminum film, is formed to cover the whole surface, and then, the surface is ground by the CMP process until a surface of the aluminum film and a surface of the third silicon oxide film become the same plan surface. As a result, the openings formed in the stacked insulator film are filled up with aluminum, as shown in FIG. 10F.

The first level wiring conductor A 303 is electrically connected to the aluminum filled in the via hole 341 to the second level wiring conductor B 331. The wiring conductors B 331 and C 332 have the thickness of about 0.5 μm and function as a second level wiring conductor. The wiring conductors D 333 has the thickness of about 1.0 μm and also functions as the second level wiring conductor.

Figure 11:
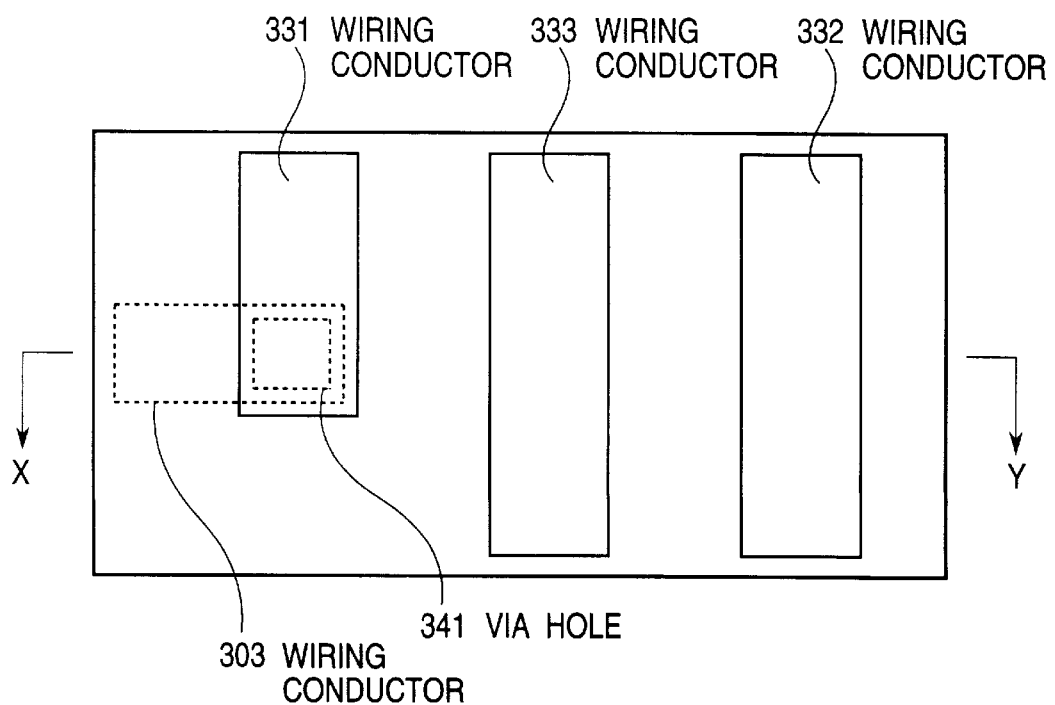
FIG. 11 is a diagrammatic plan view of a third embodiment of the semiconductor device in accordance with the present invention, manufactured in accordance with the process illustrated in FIGS. 10A to 10F.

FIG. 11 is a diagrammatic plan view of the semiconductor device in accordance with the third embodiment of the present invention, and a sectional view taken along the line X-Y in FIG. 11 corresponds to FIG. 10F. In addition, FIGS. 12A to 12C illustrate mask patterns used in the above mentioned photolithographic steps in the case that the photolithographic processes are a positive photoresist process. FIG. 12A illustrates the mask pattern for the first level wiring conductor A, and FIG. 12B illustrates the mask pattern of the through-hole type opening 320 for the via hole and the second groove type opening 321 for the wiring conductor D. FIG. 12C illustrates the mask pattern of the first groove type openings 311 and 312 for the wiring conductors B and C.

In this third embodiment, since the stacked insulator film includes the nitride film sandwiched between the oxide films, the nitride film acts as the etching stopper in the process of etching the groove type opening, and therefore, the depth of the groove type opening can be precisely controlled. In addition, when the second groove type opening 321 is etched, since the underlying first nitride film 351 acts as the etching stopper, a short-circuiting with an underlying wiring conductor or the substrate can be prevented even if the etching time becomes excessively long.

In the above mentioned first to third embodiments, the examples of forming the first level wiring conductor and the second level wiring conductors have been described. However, the present invention can be applied to any semiconductor device having a multilevel interconnection, regardless of the number of wiring conductors.

In the above mentioned first to third embodiments, the first level wiring conductor and the second level wiring conductors are formed of aluminum, but can be formed of a single metal selected from the group consisting of, for example, copper, tungsten, titanium, molybdenum, palladium, scandium and magnesium, or an alloy of aluminum and at least one metal selected from the group as mentioned just above.

Furthermore, in the above mentioned first to third embodiments, the first level wiring conductor and the second level wiring conductors are in a single layer structure, but may be constituted of a multilayer structure. For example, the multilayer structure can be formed to include an upper layer or an lower layer, each of which is formed of titanium, titanium nitride, titanium tungsten, tungsten, tungsten silicide, or molybdenum.

As seen from the above, since the present invention is characterized in that at least two grooved wiring conductors having different film thicknesses are provided in the same wiring conductor level, the circuit can be designed with a high degree of freedom in the circuit design taking the wiring resistance and the wiring capacitance into consideration. Therefore, the circuit design can be simplified, and also, both the circuit operation speed and the elevated integration density can be elevated. In addition, these advantages can be enjoyed with no additional step in the manufacturing process, and therefore, neither the production cost nor the production time is increased. Thus, a high performance semiconductor device can be manufactured easily and inexpensively.

The invention has thus been shown and described with reference to the specific embodiments. However, it should be noted that the present invention is in no way limited to the details of the illustrated structures but changes and modifications may be made within the scope of the appended claims.

What is claimed is:

1. A method for manufacturing a semiconductor device, comprising the steps of:

forming a first level insulator film on a silicon substrate;

forming a first level wiring conductor on said first level insulator;

forming a second level insulator film to cover said first level wiring conductor and said first level insulator film;

forming a through-hole type opening and first and second groove type openings in said second level insulator film;

forming a metal layer to cover the whole surface of said second level insulator and to fill up said through-hole type opening and said first and second groove type openings; and partially removing said metal layer until a surface of said second level insulator film and a surface of said metal layer become substantially the same surface, wherein said first groove type opening is formed in said second level insulator film by a first photolithography and etching process at first and second locations, the first location partially overlapping with a region of said first level wiring conductor and being different from the second location, and thereafter, said through-hole type opening and said second groove type opening, having a depth different from that of said first groove type opening, are formed in said second level insulator film by a second photolithography and etching process at third and fourth locations, respectively, the third location partially overlapping with said first location, and the fourth location being different from said first and second locations, so that said metal layer filled in said through-hole type opening is electrically connected with said first level wiring conductor, and said metal layer filled in said first groove type opening formed at said second location has a first thickness, and said metal layer filled in said second groove type opening formed at said fourth location has a second thickness different from said first thickness.

2. A method as claimed in claim 1, wherein said second location and said fourth location are separated from each other and from each of said first and third locations, so that said metal layer filled in said first groove type opening formed at said second location is electrically insulated from said first level wiring conductor, and said metal layer filled in said second groove type opening formed at said fourth location is electrically insulated from said first level wiring conductor and from said metal layer filled in said first groove type opening formed at said second location.

3. A method as claimed in claim 1, wherein said through-hole type opening and said second groove type opening are formed deeper into the second level insulator film than said first groove type opening, so that said metal layer filled in said second groove type opening formed at said fourth location has a thickness that is larger than said metal layer filled in said first groove type opening formed at said second location.

4. A method as claimed in claim 2, wherein said first groove type opening is formed in said second level insulator film by said first photolithography and etching process also at a fifth location which is different from each of said first and second locations, the fifth location not overlapping with said region of said first level wiring conductor, and said second groove type opening formed at said fourth location overlaps with neither said first location nor said second location but partially overlaps with said fifth location, so that said metal layer filled in said second groove type opening formed at said fourth location has a thickness that is larger than that of said first groove type opening formed at said second location and is electrically insulated from said first level wiring conductor.

5. A method as claimed in claim 2, wherein said first groove type opening is formed in said second level insulator film by said first photolithography and etching process also at a fifth location which is different from each of said first and second locations, the fifth location not overlapping with said region of said first level wiring conductor, and said second groove type opening is formed in said second level insulator film by said second photolithography and etching process also at a sixth location which partially overlaps with said fifth location, so that said metal layer filled in said second groove type opening formed at said sixth location has a thickness larger than that of said first groove type opening formed at said second location and that of said second groove type opening formed at said fourth location and is electrically insulated from said first level wiring conductor.

* * * * *